(12) United States Patent
Chan et al.

(10) Patent No.: US 6,333,247 B1
(45) Date of Patent: Dec. 25, 2001

(54) TWO-STEP MOSFET GATE FORMATION FOR HIGH-DENSITY DEVICES

(75) Inventors: Kevin K. Chan, Staten Island; Erin C. Jones, Tuckahoe; Paul M. Solomon, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,225

(22) Filed: Feb. 10, 2000

Related U.S. Application Data

(60) Provisional application No. 60/119,418, filed on Feb. 10, 1999.

(51) Int. Cl.[7] .................... H01L 21/3205; H01L 21/4763
(52) U.S. Cl. .............................................. 438/586; 438/589
(58) Field of Search ..................... 438/197, 287, 438/294, 296, 299, 301, 303, 585, 586, 587, 588, 589, 591, 592; 257/288, 327, 408, 410

(56) References Cited

U.S. PATENT DOCUMENTS 6,054,355 * 4/2000 Inumiya et al. .................... 438/296

* cited by examiner

*Primary Examiner*—Charles Bowers
*Assistant Examiner*—Evan Pert
(74) *Attorney, Agent, or Firm*—Casey P. August, Esq.; McGinn & Gibb, PLLC

(57) ABSTRACT

A method of manufacturing a metal-oxide-semiconductor field effect transistor MOSFET device gate includes patterning and etching the mesa of a gate material. A dielectric layer is formed on the mesa and is planarized using chemical mechanical polishing (CMP). The active gate dimension is patterned and etched to form source and drain wells that extend down to an active area on either side of the MOSFET gate. In one further embodiment, the wells are filled with metal and the metal is planarized. The MOSFET device, in one embodiment, includes source and drain wells equally spaced from the active gate.

19 Claims, 9 Drawing Sheets

TWO-STEP MOSFET GATE FORMATION FOR HIGH-DENSITY DEVICES

CROSS-REFERENCE TO RELATED APPLICATION

The present application is related to a new U.S. Patent Application, filed concurrently, to Jones et al., entitled "METHOD FOR MAKING DOUBLE GATE FIELD EFFECT TRANSISTORS USING CONDUCTING SIDE-WALL CONTACTS USING CHEMICAL MECHANICAL POLISHING", having IBM Docket No. YO999-073, assigned to the present assignee, and incorporated herein by reference.

The present application is further related to Provisional Patent Application No. 60/119,418, filed Feb. 10, 1999, to Jones et al., entitled "METHOD FOR MAKING SINGLE AND DOUBLE GATE FIELD EFFECT TRANSISTORS USING CONDUCTING SIDEWALL CONTACTS USING CHEMICAL MECHANICAL POLISHING", having IBM Docket No. YO999-073, assigned to the present assignee, and incorporated herein by reference.

The U.S. Government has a paid-up license in this invention and the right in limited circumstances to require the patent owner to license others on reasonable terms as provided for by the terms of N66001-97-1-8908 awarded by the Defense Advanced Research Projects Agency (DARPA).

BACKGROUND OF THE INVENTION

1. Field of the Invention

The present invention generally relates to metal-oxide-semiconductor field effect transistor (MOSFET) designs, and more particularly, to a patterning method and design for MOSFET device gates.

2. Description of the Related Art

Density, scalability, and manufacturability are important considerations in metal-oxide-semiconductor field effect transistor (MOSFET) designs. As MOSFET device miniaturization proceeds, the lithography needed to produce small device features becomes difficult. One concern is how the depth of focus of lithographic systems decreases as the size of the features to be printed decreases. This means that where small features are to be distinguished, topography on the wafers much be kept to a minimum. In miniatured devices, many elements of the device fabrication must change. Low resistance contacts to the MOSFET source and drain areas become difficult to make, and self-aligned, elevated source/drain structures look attractive for reducing source/drain series resistance and short channel effects (J. Y. Tsai and C. M. Osburn, Proc. of 6th Int. Symp. Ultralarge Scale Integration Sci. Tech., Montreal, CA, May 5–9, 1997, p. 429). Other materials that may be useful in scaled devices are high-k dielectrics like metal oxides, for example, which can raise the MOSFET gate capacitance without increasing the gate leakage current and without compromising the device breakdown characteristics.

Using metallic materials for the MOSFET gate conductors are also an important area of research, as a metal gate can reduce the gate resistance and gate delay. However, both of these materials require that processing temperature remain low, and so the materials cannot be used until after the doped source/drain areas are annealed. This problem has led to the idea of creating a dummy or stand-in MOSFET gate structure (e.g. out of nitride) instead of a real gate at the appropriate step in the process. After dummy formation, the steps of processing the source/drain regions, removing the dummy gate, depositing or growing a high-k gate dielectric, and depositing a metallic gate material are performed.

It is necessary that the new gate be self-aligned to the position and size of the dummy gate, which has led to the development of a "damascene" gate process. In the "damascene" process, the dummy gate is formed, source/drain doping is performed, a dielectric is formed and CMP is performed to planarize to the level of the topgate. Then, the dummy gate is removed, followed by forming a well, depositing the gate dielectric and gate conductor and planarizing with CMP to fill the well left behind (T. Saito, A. Yagishita, S. Inumiya, K. Nakajima, Y. Akasaka, Y. Ozawa, H. Yano, K. Hieda, K. Suguro, T. Arikado, K. Okamura, Jpn. J. Appl. Phys. 1, vol. 38, no. 4B, April 1999, p. 2227).

The result of the "damascene" gate process is an improved MOSFET device with improved and reduced device topography over a conventional MOSFET and enables the easy use of a replacement gate, but has no advantages with respect to source/drain resistance over a conventional device. In Saito's design, contacts to the source/drain must be made using an additional patterning step and cutting through the planarized oxide to reach the source/drain silicide. This means that a significant overlay tolerance must be included so that the source/drain contacts do not touch the gate.

One drawback to the Saito design is that it does not provide for a reduction in overall device size as compared to a conventional gate design. The additional patterning step and cutting require inclusion of a lithography alignment tolerance in the spacing between the source and drain contacts with respect to the gate. The lithography alignment tolerance acts as a buffer between the gate and the contact necessary to insure there not be a short between the gate and the contact when cutting the contacts. As a result of the alignment tolerance, the minimum device size is increased.

A second drawback to the Saito design is the differing source metal-to gate and drain metal-to-gate capacitances. During the additional patterning step, perfect positioning (i.e., equal distance between the gate and the metal fill on either side) is nearly impossible. As a result of the differing distances, the source/drain metal-to-gate capacitances will not be equal.

SUMMARY OF THE INVENTION

In view of the foregoing and other problems, disadvantages, and drawbacks of the conventional MOSFETs the present invention has been devised, and it is an object of the present invention to provide a method for an improved MOSFET design.

This new method changes the traditional one-step MOSFET gate etch to a two-step process using two etches with a CMP planarization in-between which creates source and drain wells on two sides of the gate. Conventional, source/drain doping and silicidation may be performed inside the well. After that, the well may be filled with metal. Filling the well with metal and planarizing the gate device before backend processing reduces device topography, and reduces the demands on backend lithography while saving a masking step. These advantages will help the future scaling and miniaturization of the MOSFET device.

The present invention, in one form thereof, is a method of manufacturing a metal-oxide-semiconductor field effect transistor (MOSFET) device gate. The method includes patterning and etching a mesa of gate material. At least one dielectric layer is formed or deposited on the mesa and the dielectric layer is planarized using chemical mechanical polishing (CMP). The gate material is then patterned to an active gate size and dimension and etched to form source and drain wells that extends down to the active area on either side of the gate. In one further embodiment, the method further includes filling the wells with metal and planarizing the metal.

The present invention, in another form thereof, is a method of manufacturing a metal-oxide-semiconductor field effect transistor (MOSFET) device gate. The gate has a starting substrate of a semiconductor wafer having gate material of a gate dielectric, gate conductor and chemical mechanical polish stopping layers deposited thereon, and will be patterned to an active gate dimension. The method includes patterning and etching a mesa of the gate material, forming at least one dielectric layer on top of the mesa of the gate material, planarizing the at least one dielectric layer down to the chemical mechanical polishing stopping layer using chemical mechanical polishing, and then patterning and etching the remaining gate material to the active device gate dimension to form source and drain wells that extend down to active areas on either side of the MOSFET gate. In one further embodiment, the method further includes filling the wells with metal and planarizing the metal.

The present invention, in yet, another form thereof, is a method of manufacturing a metal-oxide-semiconductor field effect transistor (MOSFET) device gate. The gate has chemical mechanical stopping layers deposited thereon. The method includes patterning and etching a mesa of the gate material, forming at least one dielectric layer on top of the mesa of the gate material, planarizing the at least one dielectric layer down to the polish stopping layer using chemical mechanical polishing, and patterning and etching the remaining gate material to the active device gate dimension to form source and drain wells that extend down to an active area on either side of the MOSFET gate. In one further embodiment, the method further includes filling the wells with metal and planarizing the metal.

The present invention includes a metal-oxide-semiconductor field effect transistor (MOSFET) device gate. The MOSFET gate includes a gate having layers of a dielectric and gate conductor. The gate has a first and a second side. The MOSFET gate also includes an active area on the first side and the second side. A source well is formed on the first side. A drain well is formed on the second side. Metal fill material is disposed within the source well and the drain well. A source well-to-gate distance is defined as a distance between the source well and the gate and a drain well-to-gate distance is defined as a distance between the drain well and the gate. The source well-to-gate distance is equal to the drain well-to-gate distance.

It is an object of the present invention to improve upon conventional MOSFET designs by using chemical mechanical polishing (CMP). CMP is a common technique for planarization of MOSFET back end structures, such as multiple levels of metal separated by planarized dielectrics, but is becoming more commonly used for front end device isolation, in steps like recessed oxide fabrication. In one embodiment of this method, CMP is used after the topgate mesa etch and to form self-aligned metal plugs over the source and drain.

This method represents a significant improvement in MOSFET manufacturability. Using this method may save one to two lithography steps, improve the planarity of finished devices, and improve device density. It also provides an easy way to form well isolated, low resistance, self-aligned contacts to the source and drain.

The idea of making a source/drain well has been described previously (e.g., see U.S. Pat. No. 5,773,331 to Solomon et al., incorporated herein by reference). An additional planarization step may be used following well formation and filling. The well regions around the gates can be filled with metal after the active device and source/drain doping is complete. Then, local interconnect metal mask level can be removed and replaced with metal deposition followed by CMP. As a result, a conventional lithography step is removed resulting in a streamlined process having few steps and allowing the active area around the source/drain to be smaller, while improving density.

The metal planarization step at the end of front end processing means that the wafer topography will be minimal at the end of the front end processing, without extra planarization. Traditional etch and metal plug steps following the planarization of the present invention result in minimal topography.

The present invention offers additional advantages to MOSFET device design. An improvement in gate conductor etching may be realized. For example, flexibility in gate conductor etching may result from patterning the MOSFET gate into a mesa first, isolating using a planarization dielectric, and then patterning the active gate later. Then, electron beam patterning with positive resist could be used to form the active gate definition, as only a small area needs patterning. In addition, it would be easy to separate n-type and p-type polysilicon gate etching by doping them before the non-critical first etch and then performing the p-type and n-type active gate patterning and etching separately.

BRIEF DESCRIPTION OF THE DRAWINGS

The foregoing and other objects, aspects and advantages will be better understood from the following detailed description of preferred embodiments of the invention with reference to the drawings, in which:

FIGS. 2(a)–2(d) are schematic diagrams of an exemplary starting wafer having active areas isolated by shallow trench isolation in which FIG. 2(a) is a bulk wafer; FIG. 2(b) is a SOI wafer; FIG.2(c) is a wafer with backgate and backgate insulator incorporated under crystalline silicon; and FIG. 2(d) is a top view of a wafer;

FIGS. 3(a)–3(c) are schematic diagrams of a topgate mesa definition by etching according to the present invention in which FIG. 3(a) is a cross-section along line AB; FIG. 3(b) is a cross-section through the gates along CD; FIG. 3(c) is a top view of the layout of the topgate mesa mask;

FIGS. 4(a)–4(c) are schematic diagrams of the topgate mesa illustrating isolation by dielectric deposition and chemical mechanical planarization in which FIG. 4(a) illustrates a main cross-section along AB; FIG. 4(b) is a cross-section through gates along CD; FIG. 4(c) is a top view of the layout of the topgate;

FIGS. 5(a)–5(c) are schematic diagrams of a gate definition of the present invention in which FIG. 5(a) is a main cross-section along AB; FIG. 5(b) is a cross-section through the gates along CD; FIG. 5(c) is a top view of the layout of the gate;

FIGS. 6(a)–6(c) are schematic diagrams illustrating the top spacers (dielectrics) and source/drain doping according to the present invention in which FIG. 6(a) is a cross-section along AB; FIG. 6(b) is a cross-section through the gates along CD; FIG. 6(c) is a view of the gate;

FIGS. 7(a)–7(c) are schematic diagrams illustrating a gate contact via etch gate and source/drain location according to the present invention in which FIG. 7(a) is a main cross-section along AB; FIG. 7(b) is a cross-section through the gates along CD; FIG. 7(c) is a top view of the gate;

FIGS. 8(a)–8(c) are schematic diagrams illustrating tungsten filling and planarization step according to a second embodiment of the present invention in which FIG. 8(a) is a main cross-section along AB; FIG. 8(b) is a cross-section through the gates along CD; FIG. 8(c) is a top view of the gate during the tungsten fill and planarization step according to the present invention; and FIGS. 9(a)–9(c) are schematic diagrams depicting a first level metallization step in which FIG. 9(a) is a main cross-section along AB; FIG. 9(b) is a cross-section through the gates along CD; and FIG. 9(c) is a top view of the first level metal mask according to the present invention.

DETAILED DESCRIPTION OF PREFERRED EMBODIMENTS OF THE INVENTION

Figure 1:
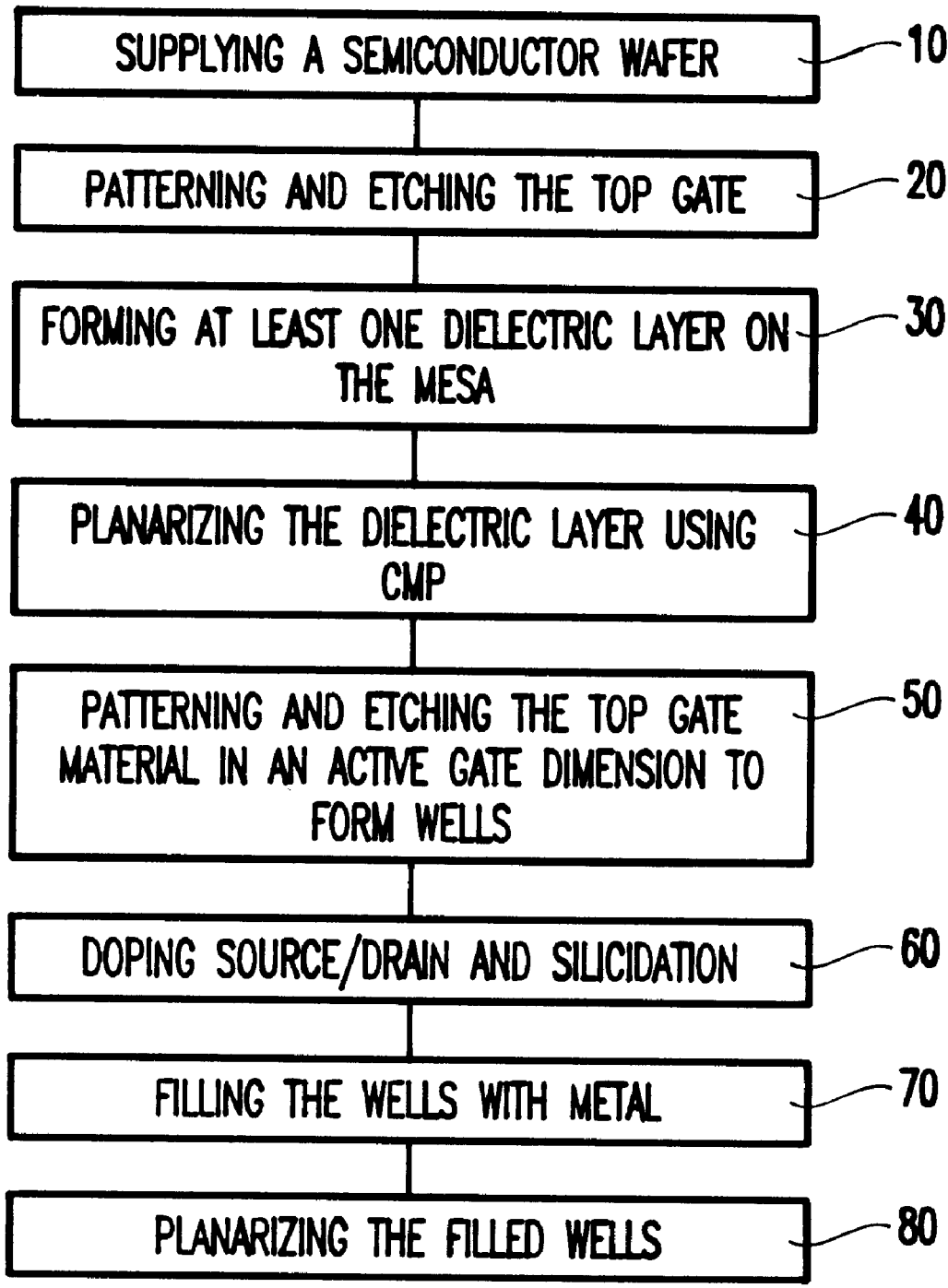
FIG. 1 is a flow diagram illustrating a preferred method of the present invention.
Figure 2A:
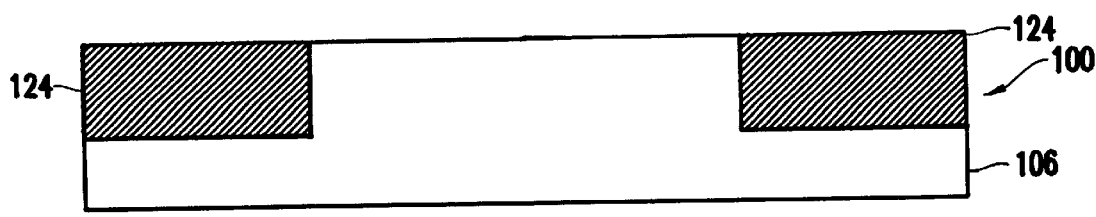
Figure 2B:
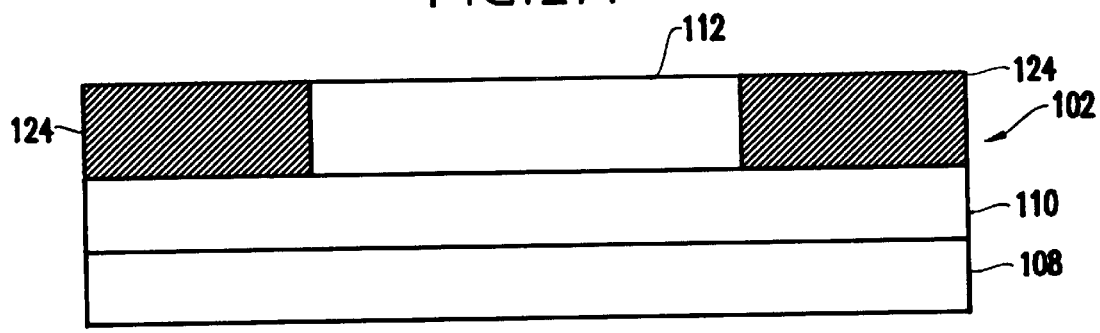
Figure 2C:
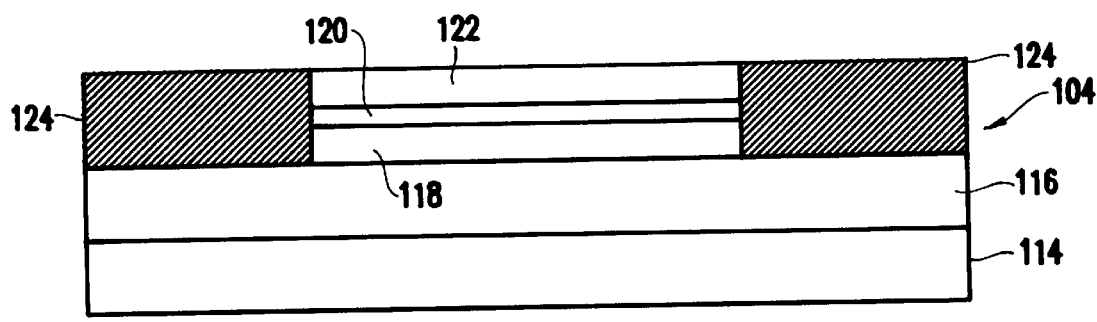

Referring now to the drawings, and more particularly to FIG. 1, there is shown a flow diagram illustrating the preferred method of the present invention. The starting material is a prepared semiconductor substrate. The prepared semiconductor substrate is supplied as a semiconductor wafer (10) with device active areas defined and isolated by some method; for example, shallow trench isolation techniques may be used to create the isolation, as shown in FIGS. 2(a)–2(c).

Specifically, in one exemplary embodiment, the gate material forms a topgate. The mesa of the gate material is patterned and etched (20). At least one dielectric layer is formed on the mesa (30). The dielectric layer is planarized using chemical mechanical polishing (CMP) (40). The gate material is patterned and etched in the active device gate dimension to form source and drain wells that extend down into an active area on either side of the MOSFET gate (50).

In one further embodiment, contact holes are also formed when patterning and etching to form the wells (50). In this further embodiment, the process of source/drain doping and silicidation occurs subsequent to contact hole formation (60).

The processes of source/drain doping and silicidation performed on the MOSFET device gate proceed using conventional methods (60). The wells formed during the active gate etch (50) are then filled with metal (70) and planarized (80). In one specific embodiment, chemical mechanical polishing (CMP) is used to planarize the metal fill (80).

Referring now to FIGS. 2(a)–2(c), various starting semiconductor wafers may be used in the method. Some examples are bulk silicon wafer 100 with silicon 106 as its starting material; SOI wafer 102 with silicon substrate 108, buried oxide 110 and silicon 112 as its starting material layers; and silicon wafer with backgate 104 having silicon substrate 114, buried oxide 116, backgate conductor 118, backgate dielectric 120 and silicon 122 layers. In all three exemplars, bulk wafer 100, SOI wafer 102 and wafer with backgate 104, oxide layer 124 is deposited and planarized.

FIGS. 2(a)–2(c) depicts the technique of shallow trench isolation (STI) of the deposited oxide layer 124 to produce the starting material substrate of a semiconductor wafer with active areas. While shallow trench isolation (STI) is depicted, other isolation techniques may be used. For example, devices isolated by local oxidation or mesa isolation are also candidates for use in the present invention. The structure and method of forming the active area may vary as long as the device active area has been isolated by some method. Depending on the desired result, an appropriate isolation method may be utilized. For example, STI may be best for minimizing device topography.

Figure 2D:
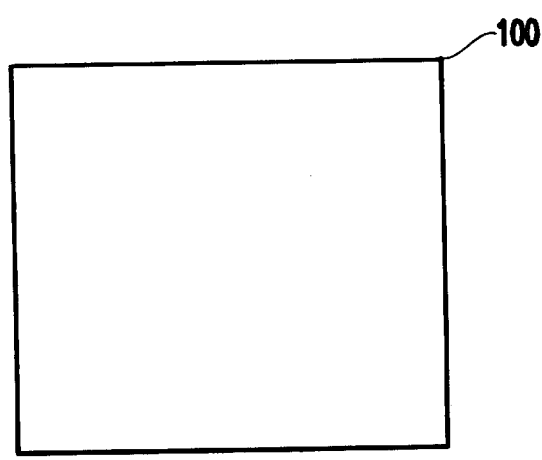

FIG. 2(d) is an exemplary layout of the active barrier mask corresponding to any of the aforementioned semiconductor wafer starting materials, bulk wafer 100, SOI wafer 102 and wafer with backgate 104.

First Embodiment

As alluded to above, the two-step gate definition method is relatively independent of the structure of the active semiconductor layers under the gate. The process can be used in many kinds of MOSFET devices. Possible starting wafers include bulk silicon wafer 100 (e.g., as shown in FIG. 2(a)), silicon on insulator (SOI) 102 (e.g., as shown in FIG. 2(b)) or more complex structures such as silicon wafer with a backgate 104 (e.g., as shown in FIG. 2(c)).

Figure 3A:
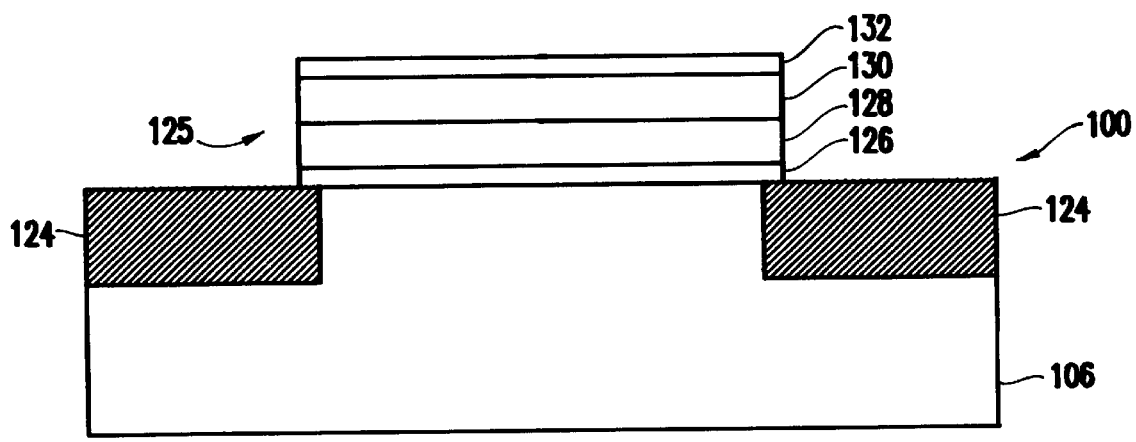
Figure 3B:
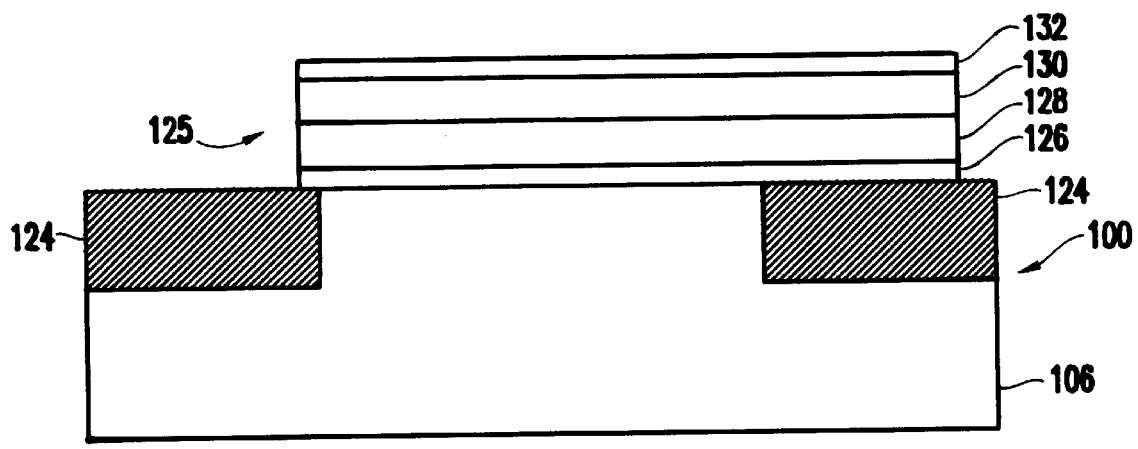
Figure 3C:
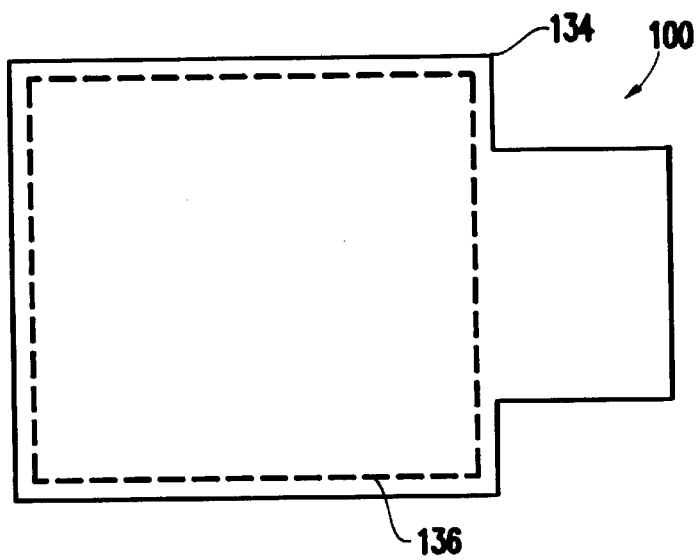

Referring now to FIGS. 3(a)–(c), for exemplary purposes, the substrate wafer starting material is a plain silicon wafer 100 with active areas defined by shallow trench isolation. Typical shallow trench isolation (STI) areas are formed by etching a trench of a few hundred nanometers in depth into the substrate, creating a thin barrier or isolation layer, filling the trench with a dielectric such as oxide somewhat thicker than the depth of the trench, then using CMP to planarize the deposited dielectric. A topgate mesa stack 125 is formed on silicon wafer 100. The topgate mesa stack 125 includes topgate dielectric 126, conducting topgate material 128. CMP stopping layers 130 are deposited on the topgate mesa stack 125. The CMP stopping layers 130 may also function as hard masks for etching.

Photoresist 132 is formed on CMP stopping layers 130. A gate mesa pattern 134 is defined in photoresist 132. The topgate mesa 125, CMP stopping layers 130 and photoresist 132 are etched down through the topgate conductor 128. If the topgate conductor 128 is not oxide, the topgate conductor 128 may be removed as well. The gate mesa pattern 134 will most likely be slightly larger than the device active area 136 (e.g., as shown in FIG. 3(c)), as this step defines the area of the source/drain wells and also the area that will be used to contact the gate (discussed below).

Figure 4A:
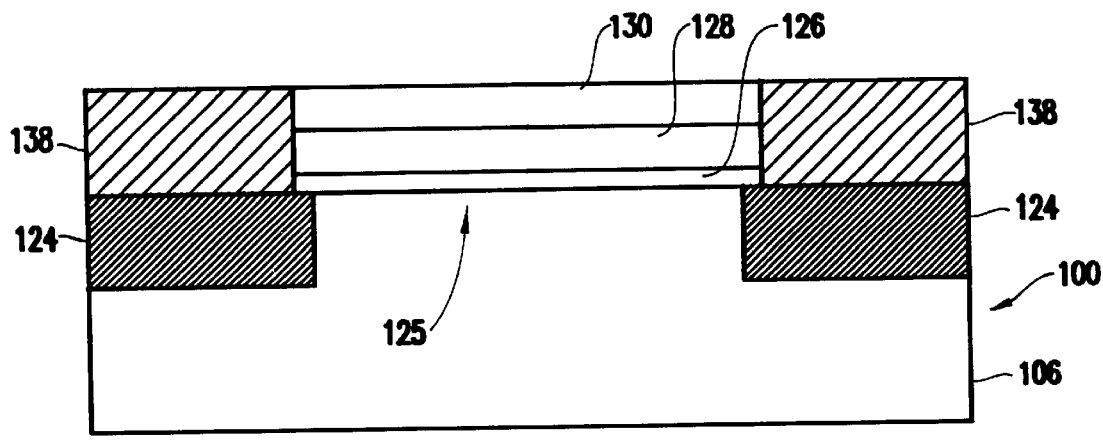
Figure 4B:
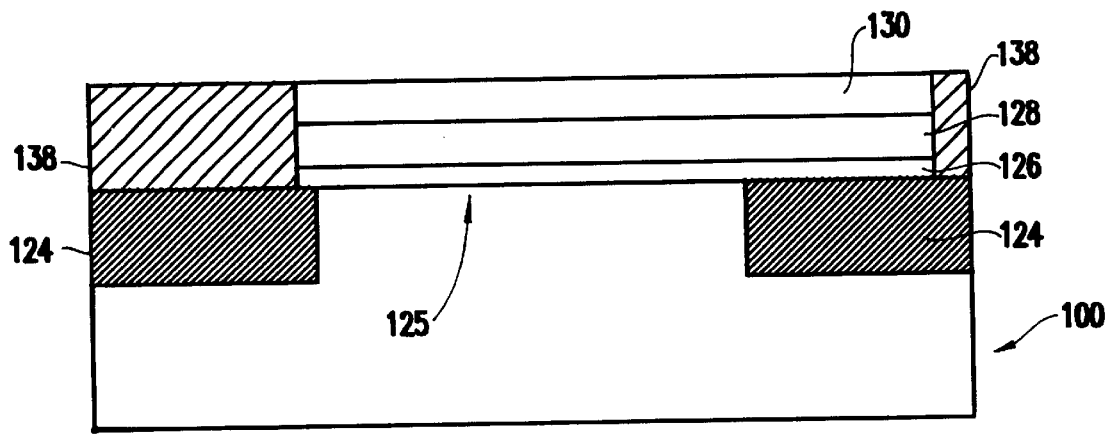
Figure 4C:
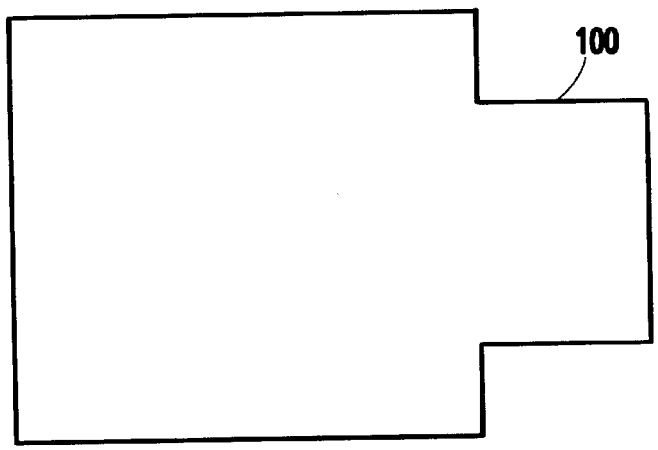

FIGS. 4(a)–(c) shows the topgate mesa stack 125 after planarization by CMP. Planarization may be accomplished by first depositing a thick layer of dielectric material 138 over the topgate mesa stack 125 to a thickness typically somewhat thicker than the total height of the topgate mesa stack. Subsequently, CMP is used to planarize dielectric material 138 back to the level of the CMP stopping layers 130.

Figure 5A:
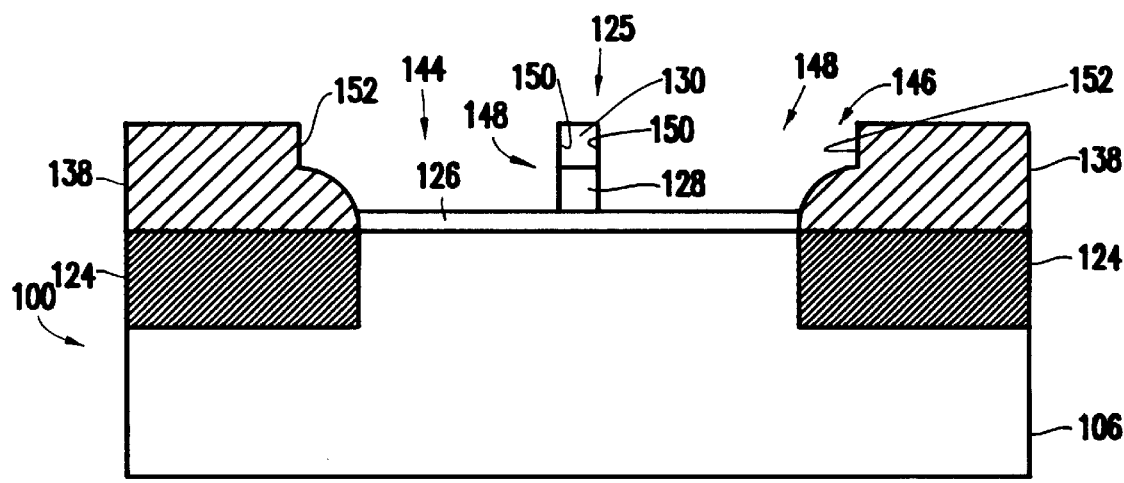
Figure 5B:
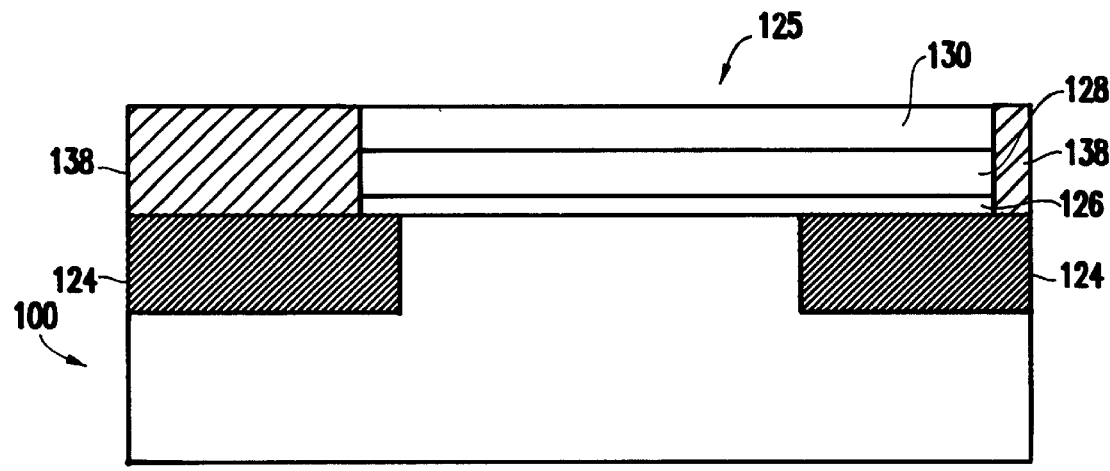
Figure 5C:
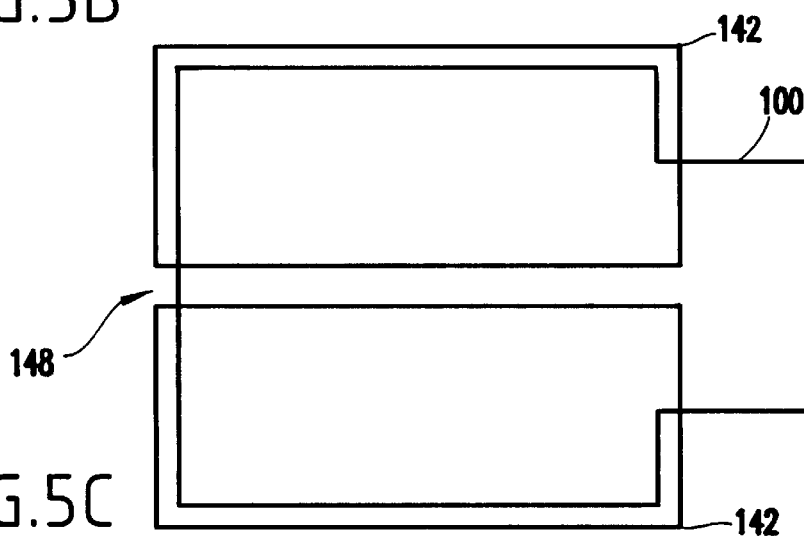

Referring now to FIGS. 5(a) and (b), the actual active device etch is illustrated. An active gate pattern would be defined in photoresist (not shown) and then etched into the materials (i.e. layers) forming the topgate mesa stack 125. An exemplary pattern 142 in this step (as shown in the mask layout 142 in FIG. 5(c)) forms source and drain wells 144, 146. Photoresist (not shown) is removed in these two wells 144, 146 forming active gate area 148. Specifically, the active gate etch removes the hard mask layer 130, CMP stopping layer, and the topgate conductor 128, topgate dielectric 126 when forming these two wells 144, 146. Wells 144, 146 are defined by inner wall 150 formed of topgate mesa stack 125 and an outer wall 152, formed of planarized deposited dielectric material 138.

Figure 6A:
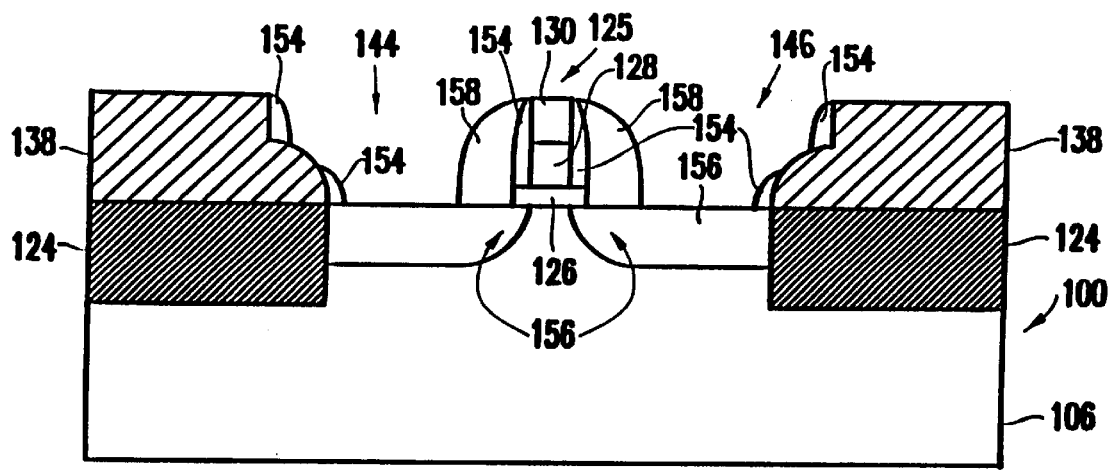
Figure 6B:
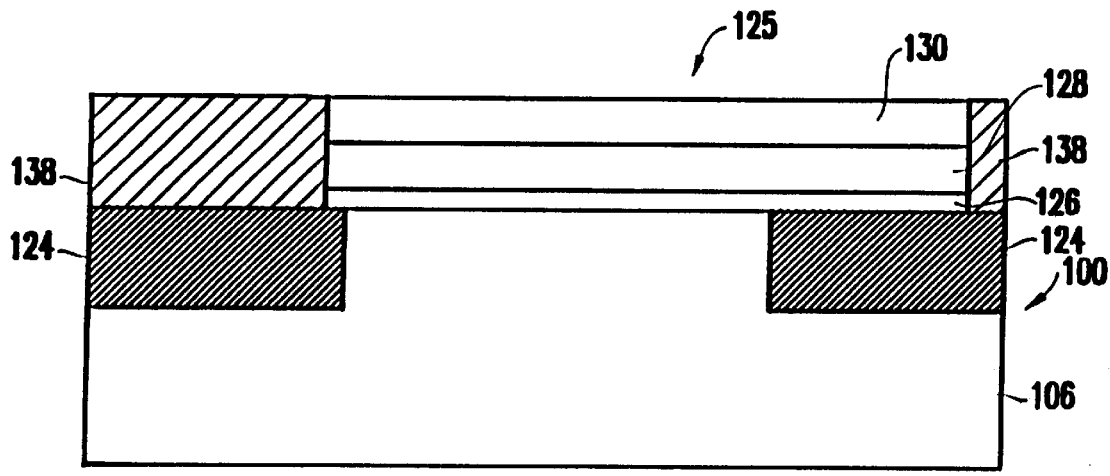
Figure 6C:
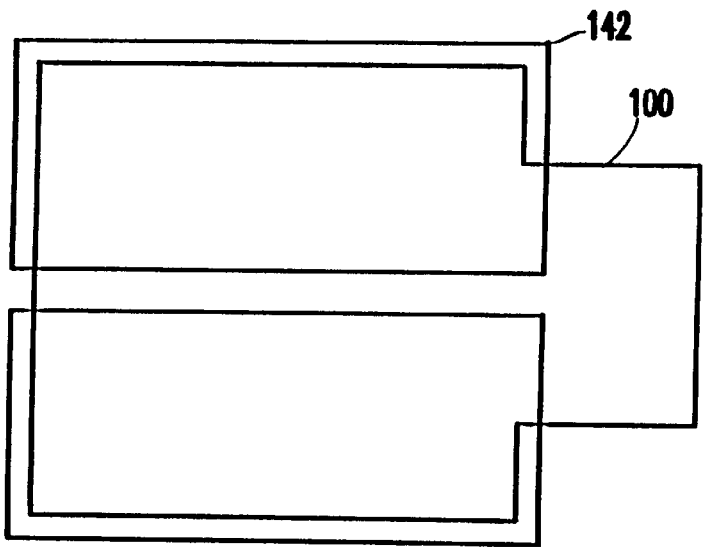

The resulting etched MOSFET gate can now be further processed using any conventional semiconductor manufacturing method. For example, as illustrated in FIG. 6, a thin dielectric spacer 154 is formed on the topgate 125. Source/drain extension regions 156 are formed first, followed by thick insulating spacer 158 formation. Then deep source/drain extension regions 156 are made. The only difference from standard source/drain and insulating spacer formation processing is that these processing steps are now taking place in a well instead of on an Si layer with planar STI outside the active region. This may have some advantages of which are currently not clear. Doping by ion implantation and thermal annealing may be used, similar to conventional MOSFET processing.

Figure 7A:
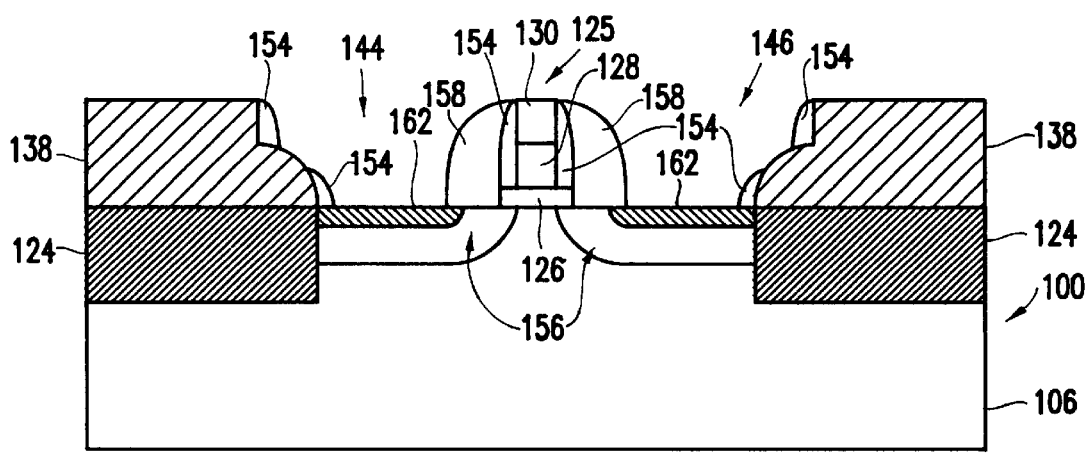
Figure 7B:
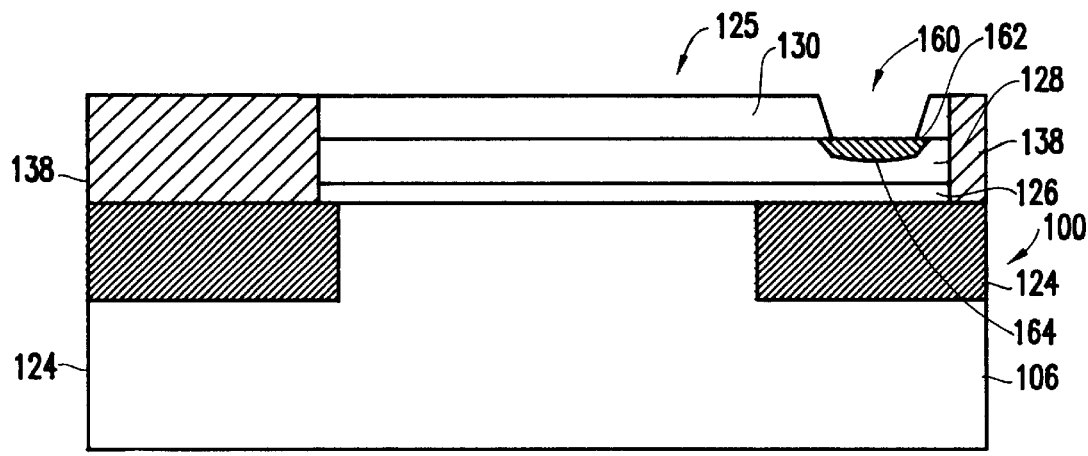
Figure 7C:
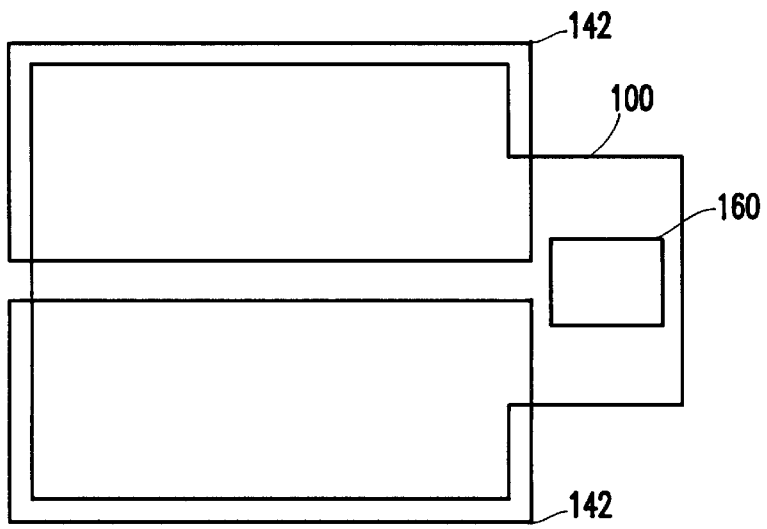

Referring to FIG. 7, in one particular embodiment, a contact hole 160 is formed in the topgate during the active gate etch. In this embodiment, the contact hole formation occurs prior to source/drain doping and silicidation shown in FIG. 6. Following contact hole 160 formation, a contact hole 160 to the topgate conductor 128 is etched and then silicide 162 is grown using a standard self-aligned silicide process on both the deep source/drain extension regions 156 and on the gate contact 164. Self-aligned silicide 162 is formed by depositing a metal such as cobalt or titanium and a capping layer such as titanium nitride on top if necessary, annealing to form a silicide phase out of only the metal which is in contact with the semiconductor, removing the cap and residual metal in a selective etch, and then performing a second anneal to reduce the silicide resistance, if necessary.

After gate spacer 158 formation, the wells 144, 146 may be regarded as contact holes that are self-aligned to the doped source and drain. One self-alignment is the elimination of one lithography masking layer which would be needed to cut contact holes after source/drain doping. A lithography alignment tolerance (i.e., additional spacing of the source and drain contacts with respect to the gate) is eliminated. The elimination of the lithography alignment tolerance results in an overall smaller MOSFET device.

Second Embodiment

Figure 8A:
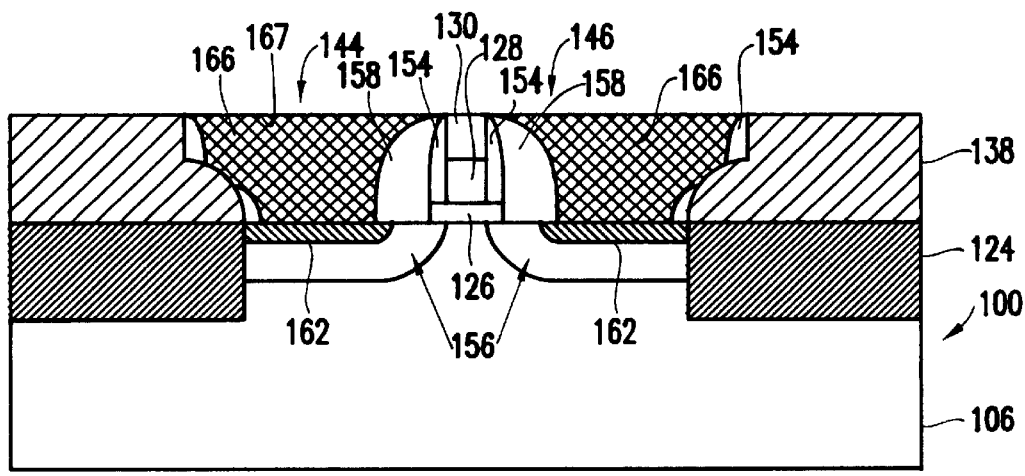
Figure 8B:
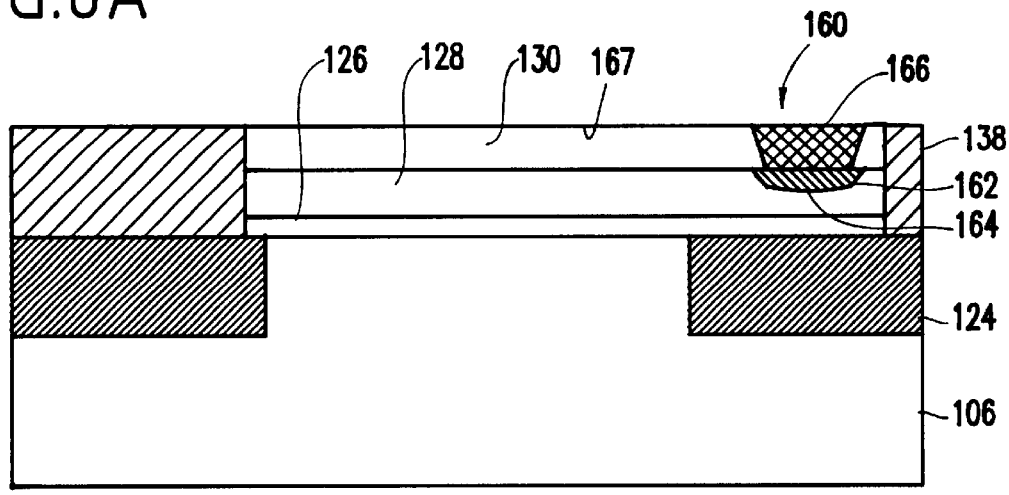
Figure 8C:
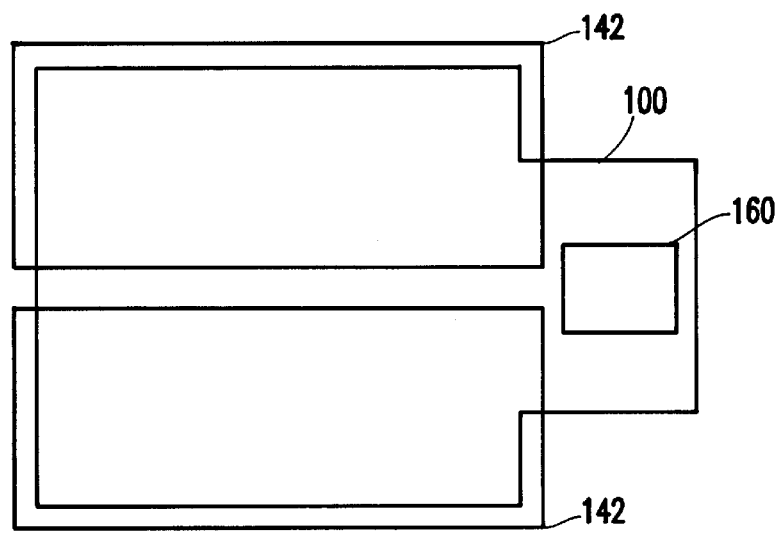

A second, further embodiment of the present invention includes an additional processing step. Referring now to FIG. 8, the source/drain wells with metal fill 166 (e.g., tungsten) are depicted. This may be done by depositing a blanket layer of CVD tungsten metal to fill the wells 144, 146 and then CMP processing back until the CMP stopping layers 130 are exposed. Alternatively, source/drain wells 144, 146 may be filled by electroplating. Gate contact 164 should also be filled at this time. Filling the gate contact 164 allows for returning the wafer surface 167 to a planar structure again following this CMP processing.

In either the first or second embodiment, metallization of the topgate may occur through the deposition of metal 170 (e.g., see FIG. 9). As illustrated, the overlay tolerance of metal 170 on the source/drain extension regions 156 can be quite relaxed, as the actual gate region is hidden from metal 170. This may be true even if the source/drain wells 144, 146 are shrunk quite aggressively in size.

The source-well-to-gate distance 172 defined as the distance between topgate 126 and metal fill 166 and the drain well-to-gate distance 174 are defined as the distance between the topgate 125 and metal fill 166 and are equal.

A source well-to-gate capacitance is defined as $$\frac{\varepsilon_{spacer\,154,158}}{\text{source well-to-metal distance 172}}$$

A drain well-to-gate capacitance is $$\frac{\varepsilon_{spacer\,154,158}}{\text{drain well-to-metal distance 174}}$$

In the preferred embodiment, the source well-to-gate distance and the drain well-to-gate distance are less than a conventional design as an additional lithography mask overlay tolerance is unnecessary and therefore eliminated.

A reduced distance 172, 174 permits smaller MOSFET overall design size. Further, equal distances 172, 174 provides for a reduced source and drain resistance but an increased capacitance compared with conventional designs. In addition, in a preferred embodiment, the source well-to-gate and drain well-to-gate capacitances will be equal.
Variations to process The present invention may be employed in separate n-type and p-type polysilicon gates etching from gate definition and source/drain well etching. As mentioned earlier, since the topgate mesa etch occurs in a non-critical area of the device, n-type and p-type polysilicon gate materials can be etched using a first etch at the same time without worrying about the difference in etch rates. Then, a second etch, for the gate definition, and source/drain well can be performed separately for the n-type and p-type gates.

Figure 9A:
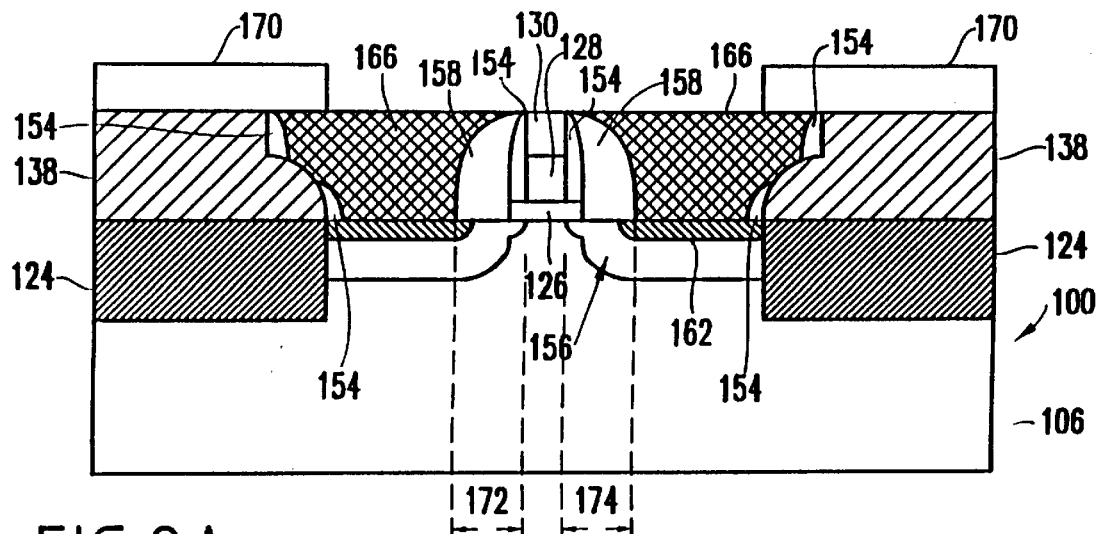
Figure 9B:
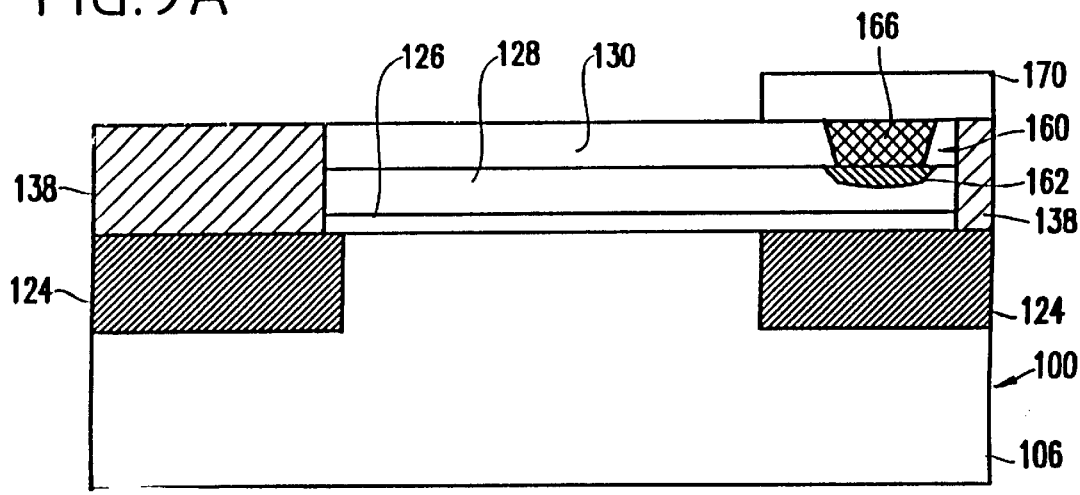
Figure 9C:
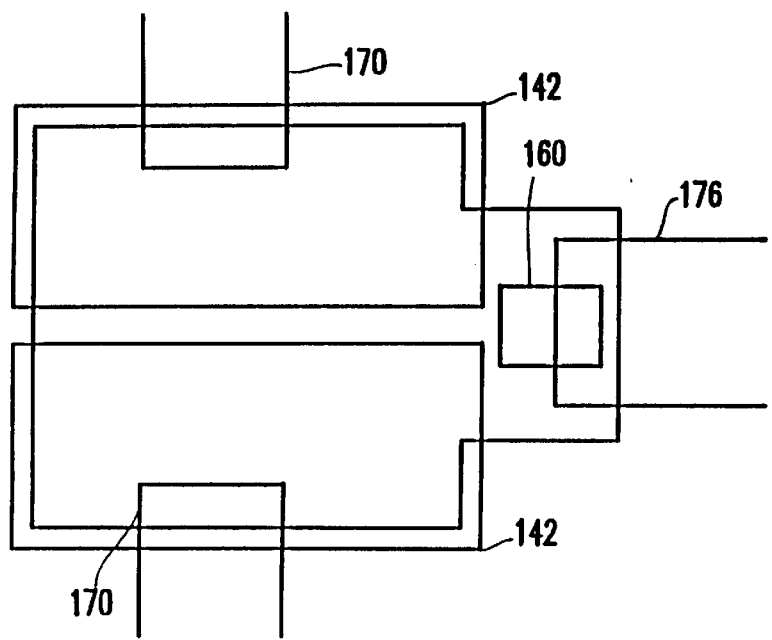

The present invention may also be used for replacement gate formation. With correct choice of materials, it should be possible to use this process and still implement a replacement gate, if high-k gate dielectrics or metal gate conduction are needed. It appears possible that high dielectric constant dielectrics such as metal oxides (e.g., ZnO2) may be needed in future devices to increase the gate capacitance without increasing the gate current and vulnerability to breakdown, and gates made of such materials as Al, TiN, Ti or W may be needed to reduce the gate resistance and reduce the gate delay, so it is important that a new device process be compatible with those materials. As these materials are not compatible with high temperature processing, the patterned gate 128 and gate oxide 126 may be removed after all high temperature processing is complete, usually after the source/drain anneals, and replaced with other materials. In this device, the metal fill 166 could be performed with tungsten, for example (as illustrated in FIGS. 9a–9c) and encapsulated to protect it from oxidation during further processing (e.g., see U.S. patent application Ser. No. 09/337,550, to K. K. Chan et al., having IBM Docket YO999-100, incorporated herein by reference). Then nitride CMP stopping materials 130, gate conductor 128 and gate dielectric 126 could be selectively removed with respect to a planarization oxide 138 (e.g., by wet etching). Then a high-k dielectric could be deposited, followed by metal being deposited to fill the gate area, and subsequent CMP planarization to polish the gate down until the gate-fill metal and source/drain fill metal do not touch. This may require polishing the gate stack longer, so the final gate stack may be shorter than the device shown in FIG. 9. Also it may be necessary that the gate spacer dielectrics 154, 158 be made wider, straighter, or an extra spacer may need to be added so that the capacitance between the gate and the source/drain contact material 166 can be held to a reasonable level.

The present invention may be incorporated with liners and stack dielectrics in place of any dielectric in the process. It may be necessary that the oxides used for planarization (e.g., oxide layer 124 and dielectric material 138) and the layers used as hard masks and CMP stopping layers 130 may ultimately need to be stacked dielectrics instead of a single layer of a single material. The STI and planarization dielectrics may be deposited oxide but require liners of thermal oxide to lower interface state densities and/or nitride to reduce erosion during processing. The hard mask/CMP stopping layer 130 may need to be a stack with oxide on the bottom for control of the polysilicon critical dimension and nitride on the top to stop the CMP. If too much of the hard mask/CMP stopping layer 130 has been eroded during the topgate etch (20), depicted in FIG. 3, or the CMP planarizing of the dielectric layer (40), depicted in FIG. 4, it may be necessary to add another layer of hard mask material CMP stopping layer on top of material 130 following the CMP processing (40) in order to have enough CMP stopping layer to successfully complete gate processing.

With this process, it is possible to fabricate a MOSFET with low resistance source/drain contacts that are self aligned to the gate, allowing minimal gate to source/drain spacing, allowing the size of the device active area to shrink, and increasing the maximum device density. It allows separate etching of p-type and n-type polysilicon gates or enables the use of metal gates and high-k dielectrics. It also provides a planar field surface at the end of MOSFET front end processing which simplifies the back-end processing of multi-level metal lines.

While the invention has been described in terms of preferred embodiments, those skilled in the art will recognize that the invention can be practiced with modification within the spirit and scope of the appended claims

What is claimed is:

1. A method of manufacturing a metal-oxide-semiconductor field effect transistor (MOSFET) device gate, the gate material having a chemical mechanical polish stopping layer deposited thereon; said method comprising:
    patterning and etching a mesa of gate material larger in size than an active gate dimension;
    forming at least one dielectric layer on the mesa;
    planarizing the at least one dielectric layer to the polish stopping layer using chemical mechanical polishing; and
    patterning and etching the gate material to the active device gate dimension to form source and drain wells that extend to the active area on either side of the gate.

2. The method of claim 1 wherein the patterning and etching the gate further forms contact holes to source and drain at a bottom portion of said source and drain wells.

3. The method of claim 1 further comprising source and drain doping and silicidation.

4. The method of claim 1 wherein said patterning and etching the gate further forms a contact hole prior to source and drain doping at a bottom portion of said source and drain wells.

5. The method of claim 1 further comprising filling the source and drain wells with metal.

6. The method of claim 5 wherein said planarizing the metal comprises chemical mechanical polishing (CMP).

7. A method of manufacturing a metal-oxide-semiconductor field effect transistor (MOSFET) device gate, the gate having a starting substrate of a semiconductor wafer having gate material of a gate dielectric, gate conductor and a chemical mechanical polish stopping layer deposited thereon; said method comprising:
    patterning and etching a mesa of the gate material larger in size than an active gate dimension;
    forming at least one dielectric layer on the mesa of the gate material;
    planarizing the at least one dielectric layer to the polish stopping layer using chemical mechanical polishing; and
    patterning and etching the gate material to the active device gate dimension to form source and drain wells that extend to the active area on either side of the MOSFET gate.

8. The method of claim 7 further comprising source and drain doping and silicidation.

9. The method of claim 7 wherein said patterning and etching the gate further forms a contact hole at a bottom portion of said source and drain wells.

10. The method of claim 7 wherein said patterning and etching the gate further forms a contact hole prior to source/drain doping at a bottom portion of said source and drain wells.

11. The method of claim 7 further comprising filling the source and drain wells with metal.

12. A method of manufacturing a metal-oxide-semiconductor field effect transistor (MOSFET) device gate, the gate having a topgate dimension, an active device gate dimension, said method comprising:
    supplying a semiconductor wafer having gate material of a dielectric, gate conductor and chemical mechanical polish stopping layers deposited thereon;
    patterning and etching a mesa of the gate material to a size larger than the active gate dimension;
    forming a dielectric layer on the mesa of the gate material;
    planarizing the dielectric layer to the polish stopping layer using chemical mechanical polishing; and
    patterning and etching the gate material to the active device gate dimension to form source and drain wells that extend to the active area on either side of the MOSFET gate.

13. The method of claim 12 further comprising source and drain doping and silicidation.

14. The method of claim 12 wherein said patterning and etching the gate further forms a contact hole at a bottom portion of said source and drain wells.

15. The method of claim 12 wherein said patterning and etching the gate further forms a contact hole prior to source and drain doping at a bottom portion of said source and drain wells.

16. The method of claim 8 further comprising filling the source and drain wells with metal.

17. A metal-oxide-semiconductor field effect transistor (MOSFET) device gate produced by the method of claim 5.

18. A metal-oxide-semiconductor field effect transistor (MOSFET) device gate produced by the method of claim 11.

19. A metal-oxide-semiconductor field effect transistor (MOSFET) device gate produced by the method of claim 16.

* * * * *